United States Patent
Song et al.

(10) Patent No.: US 10,680,656 B2
(45) Date of Patent: Jun. 9, 2020

(54) MEMORY CONTROLLER, MEMORY SYSTEM INCLUDING THE SAME, AND OPERATION METHOD THEREOF

(71) Applicant: SK hynix Inc., Gyeonggi-do (KR)

(72) Inventors: Young-Ook Song, Seoul (KR); Sang-Gu Jo, Gyeonggi-do (KR); In-Hwa Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 20 days.

(21) Appl. No.: 16/046,223

(22) Filed: Jul. 26, 2018

(65) Prior Publication Data
US 2019/0165816 A1 May 30, 2019

(30) Foreign Application Priority Data

Nov. 30, 2017 (KR) .................. 10-2017-0163394

(51) Int. Cl.
*H03M 13/29* (2006.01)
*G06F 11/10* (2006.01)
*H03M 13/15* (2006.01)

(52) U.S. Cl.
CPC ......... *H03M 13/2906* (2013.01); *G06F 11/10* (2013.01); *G06F 11/1076* (2013.01); *H03M 13/1515* (2013.01)

(58) Field of Classification Search
CPC .................................................. H03M 13/2906
USPC ........................................ 714/755, 757, 759
See application file for complete search history.

(56) References Cited

U.S. PATENT DOCUMENTS

| | | | | |
|---|---|---|---|---|
| 8,595,415 B2* | 11/2013 | Van Aken | ............ | G06F 12/0246 711/103 |
| 8,626,989 B2* | 1/2014 | Van Aken | ............ | G06F 12/0246 711/103 |
| 8,804,422 B2* | 8/2014 | Chung | .................... | G11C 16/10 365/185.03 |
| 9,110,827 B2* | 8/2015 | Sakai | .................. | G06F 11/1012 |
| 9,432,298 B1* | 8/2016 | Smith | ................. | H04L 49/9057 |
| 9,685,217 B2* | 6/2017 | Romanovskyy | ...... | G11C 11/406 |
| 9,953,702 B2* | 4/2018 | Son | ........................ | G11C 29/42 |

FOREIGN PATENT DOCUMENTS

KR 1020140061304 5/2014
KR 1020160127168 11/2016

* cited by examiner

*Primary Examiner* — Fritz Alphonse
(74) *Attorney, Agent, or Firm* — IP & T Group LLP

(57) ABSTRACT

A memory controller includes a command input unit suitable for receiving a write command, a read command, and a send command, a command counting unit suitable for performing a counting operation in response to the write command to produce a counted data, a first Error Correction Code (ECC) encoding unit suitable for performing a first ECC encoding onto a data that is read from a memory device in response to the read command to produce a first ECC encoded data, a second ECC encoding unit suitable for performing a second ECC encoding onto the counted data in response to the send command to produce a second ECC encoded data, and a data output unit suitable for combining the first ECC encoded data and the second ECC encoded data to output a read data.

20 Claims, 4 Drawing Sheets

US 10,680,656 B2

MEMORY CONTROLLER, MEMORY SYSTEM INCLUDING THE SAME, AND OPERATION METHOD THEREOF

CROSS-REFERENCE TO RELATED APPLICATIONS

The present application claims priority under 35 U.S.C. § 119(a) to Korean Patent Application No. 10-2017-0163394, filed on Nov. 30, 2017, which is incorporated herein by reference in its entirety.

BACKGROUND

1. Field

Exemplary embodiments of the present invention relate to a memory system and, more particularly, to a memory system for performing an Error Correction Code (ECC) operation onto a read data, and a method for operating the memory system.

2. Description of the Related Art

A memory system is used as a main memory device or an auxiliary memory device for various consumer or industrial electronic devices such as a computer, a mobile phone, a Portable Digital Assistant (PDA), a digital camera, a game player, a navigation device, and the like. Memory devices realizing the memory system may include volatile memory devices such as a Dynamic Random Access Memory (DRAM), a Static Random Access Memory (SRAM) and the like, and non-volatile memory devices such as a Read Only Memory (ROM), a Mask ROM (MROM), a Programmable ROM (PROM), an Erasable Programmable ROM (EPROM), an Electrically Erasable Programmable ROM (EEPROM), a Ferroelectric RAM (FRAM), a Phase-Change RAM (PRAM), a Magneto-resistive RAM (MRAM), a Resistive RAM (RRAM), a flash memory and the like.

The memory system operates in response to a command inputted from an electronic device, e.g., a host. Diverse kinds of commands may be generated and inputted according to a channel protocol established between the memory system and the host. For example, a write command, a read command, and a send command may be generated in a host and inputted into a memory module such as a Dual In-line Memory Module (DIMM), particularly, a non-volatile DIMM (NVDIMM)-P. To operate the memory device according to the commands, a memory controller may be provided in the inside of the DIMM. An internal command such as active, precharge, and the like may be generated by the memory controller.

The host may only control such commands as data write, data read, and data fetch commands. For example, the host may transfer a write command and data to the memory controller of a memory system, regardless of the operation of the memory device of the memory system. However, since the speed of a write operation of the memory device and the speed of processing of a write command in the memory controller are limited, the number of available write commands to be sent by the host must be checked. Thus, typically in a memory system, the memory controller may check the number of write commands inputted from the host. The memory controller may notify the host of write credit information indicating both the number of checked write commands and the number of available write commands to be sent by host.

SUMMARY

Embodiments of the present invention are directed to a memory system that performs an Error Correction Code (ECC) operation onto a read data, and a method for operating the memory system. The ECC operation may include separately performed multi-step sub-operations. The ECC operation may include two separately performed sub-operations: a first one performed before a send command regarding the read data is not issued, and a second one performed in response to the send command.

In accordance with an embodiment of the present invention, a memory controller includes: a command input unit suitable for receiving a write command, a read command, and a send command; a command counting unit suitable for performing a counting operation in response to the write command to produce a counted data; a first Error Correction Code (ECC) encoding unit suitable for performing a first ECC encoding onto a data that is read from a memory device in response to the read command to produce a first ECC encoded data; a second ECC encoding unit suitable for performing a second ECC encoding onto the counted data in response to the send command to produce a second ECC encoded data; and a data output unit suitable for combining the first ECC encoded data with the second ECC encoded data to output a read data.

In accordance with an embodiment of the present invention, a memory system includes: a memory device that includes a plurality of memory cells; and a memory controller suitable for reading a data stored in the memory device in response to a read command and performing a first Error Correction Code (ECC) encoding onto the read data to produce a first ECC encoded data, wherein the memory controller counts a write command to produce a counted data, performs a second ECC encoding onto the counted data in response to a send command so as to produce a second ECC encoded data, and outputs the first ECC encoded data and the second ECC encoded data as a read data.

In accordance with an embodiment of the present invention, a method for operating a memory system includes: performing a counting operation in response to a write command to produce a counted data; reading a data from a memory device in response to a read command; performing a first Error Correction Code (ECC) encoding onto the read data to produce a first ECC encoded data; performing a second ECC encoding onto the counted data in response to a send command to produce a second ECC encoded data; and combining the first ECC encoded data with the second ECC encoded data to output a read data.

In accordance with an embodiment of the present invention, a memory system includes: a memory device for storing data; and a memory controller suitable for: performing a first ECC encoding on a data transferred from the memory device, in response to a read command; and performing a second ECC encoding on a counted data regarding a write command, in response to a send command, to generate a read data including results of the first and second ECC encodings.

DETAILED DESCRIPTION

Figure 1:
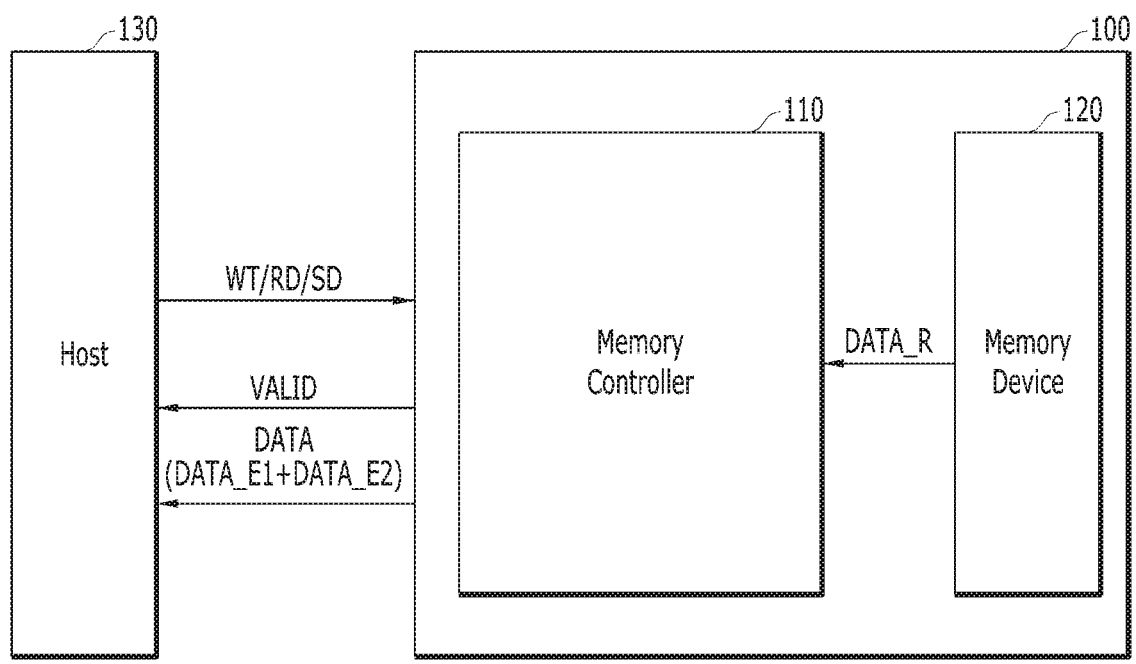
FIG. 1 is a block diagram illustrating a memory system operatively coupled to a host, in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In describing the present disclosure, when it is determined that the detailed description of the known related art may obscure the gist of the present disclosure, the detailed description thereof will be omitted.

Although the terms such as first and second may be used to describe various components, the components are not limited by the terms, and the terms are used only to distinguish components from other components.

As used herein, singular forms are intended to include the plural forms as well, unless the context clearly indicates otherwise.

It will be further understood that the terms "includes", and "including" are used interchangeably with the open ended terms "comprises", "comprising", to specify the presence of any stated elements and to not preclude the presence or addition of one or more other elements.

Also, as used herein, the term "and/or" includes any and all combinations of one or more of the associated listed items.

In the following description, numerous specific details are set forth in order to provide a thorough understanding of the present invention. The present invention may be practiced without some or all these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a memory system 100, is according to an embodiment of the present invention. The memory system 100 may operate in response to at least one of a read, write or send command (WT/RD/SD) inputted from a host 130.

Referring to FIG. 1, memory system 100 may include a memory controller 110 and a memory device 120. The memory device 120 may include a plurality of memory cells. The memory cells may be organized according to any suitable configuration. The memory cells may be arranged in a two- or three-dimensional matrix. The memory controller 110 may control an operation of the memory device 120 in response to at least one of a read, write or send command (WT/RD/SD) inputted from the host 130.

The memory controller 110 may perform a read operation of the memory device 120. Specifically, the memory controller 110 may read a data stored in a memory address of the memory device 120 in response to a read command RD. The memory address may correspond to a logical address received from the host 130 corresponding to the read command. The memory controller 110 may first store the read data DATA_R in an internal buffer (not shown). The memory controller 110 may output the data stored in the buffer as a read data DATA in response to a send command SD received from the host 130. Herein, when the data DATA_R read from the memory device 120 is stored in the internal buffer of the memory controller 130, the memory controller 110 may output a valid signal VALID to the host 130. The host 130 may then, upon receipt of the valid signal VALID, generate a send command SD and transmit the send command SEND to the memory controller 110 so that the memory controller 110 may then transmit the read data DATA which are stored in the internal buffer of the memory controller 110 to the host 130. This method may also be referred to herein as a Hand Shaking method.

As described above, the memory controller 110 may check a write command WT inputted from the host 130. The memory controller 110 may notify the host 130 of write credit information representing the number of write commands WT that the host 130 may currently send. In general, the memory controller 110 may count the write commands WT inputted from the host 130 and output the write credit information corresponding to the count value to be included in the read data DATA when the read data DATA is transferred.

Meanwhile, an ECC operation may be applied to detect and correct errors that may occur in the channel between the memory system 100 and the host 130. Herein, the memory controller 110 may perform an ECC encoding on the data DATA_R read from the memory device 120 to transfer the encoded data as the read data DATA. When the memory controller 110 transfers the write credit information together with the read data DATA to the host 130, the memory controller 110 may perform the ECC encoding on the read data DATA_R with the write credit information in.

Whenever the write command WT is inputted from the host 130, the memory controller 110 may update the write credit information in real time and notify the host 130 of the latest updated information. Therefore, at a moment when the send command SD is inputted from the host 130, the memory controller 110 may detect the write credit information, perform an ECC encoding onto the detected information and the read data DATA_R, and output the read data DATA. As a result, after the send command SD is inputted, an operation time according to the ECC encoding may be added to affect the read latency of the memory system 100.

The memory controller 110 according to the embodiment of the present invention may perform the ECC encoding of the read operation according to the read/send command (RD/SD) in two encoding steps. Specifically, in response to a read command RD, the memory controller 110 reads the data stored in the memory device 120 and perform a first ECC encoding onto the read data DATA_R to generate a first ECC encoded data DATA_E1. Also, the memory controller 110 may count the write command WT and perform a second ECC encoding onto the counted data in response to the send command SD to generate a second ECC encoded data DATA_E2. Then, the memory controller 110 may combine the first ECC encoded data DATA_E1 and the second ECC encoded data DATA_E2 and output the read data DATA.

By the way of example but not limitation, the memory controller 110 may first perform a first ECC encoding onto a data that is read out of the memory device 120 and prepared in response to the read command RD. The memory controller 110 may detect the write credit information at a moment when the read data actually goes out in response to the send command SD and additionally perform a second ECC encoding taking into account the write credit information. Therefore, the memory controller 110 may perform the multi-step ECC operation onto the read data DATA while providing the write credit information in real time using the read data DATA. In this way, it is possible to prevent an increase in read latency. The structure of the memory controller 110 according to the embodiment of the present invention will be described in more detail with reference to FIG. 2.

Figure 2:
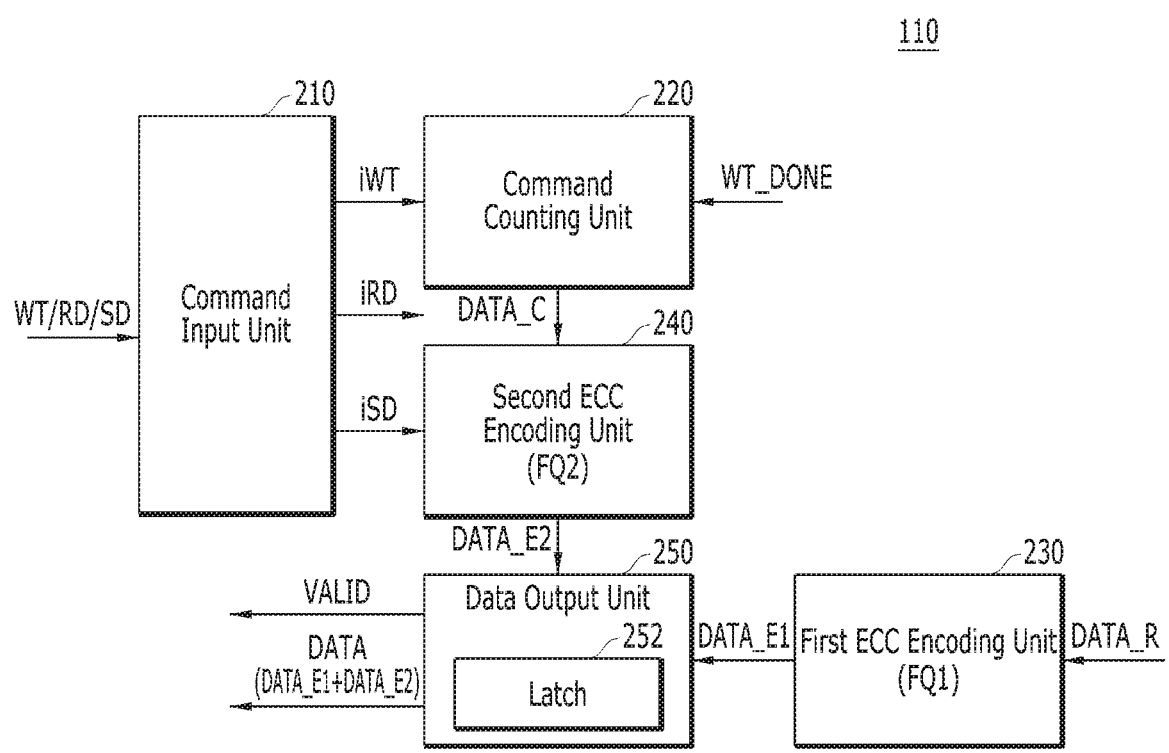
FIG. 2 is a block diagram illustrating an exemplary configuration of a memory controller employed in the memory system shown in FIG. 1.

FIG. 2 is a block diagram illustrating the memory controller shown in FIG. 1. Referring to FIG. 2, the memory controller 110 may include a command counting unit 220, a first ECC encoding unit 230, a second ECC encoding unit 240, and a data output unit 250. According to the described embodiment of FIG. 2, the memory controller 110 may further include a command input unit 210.

The command input unit 210 may generate internal control signals in response to a write command WT, a read command RD, and a send command SD inputted from the host 130. For example, the command input unit 210 may decode the write command WT, the read command RD, and the send command SD to generate an internal write signal iWT, an internal read signal iRD, and an internal send signal iSD, respectively.

The command counting unit 220 may perform a counting operation in response to the internal write signal iWT received from the command input unit 210. The command counting unit 220 may count an input of the internal write signal iWT. Herein, the memory controller 110 may write a data into the memory device 120 according to the internal write signal iWT. When the data is written into the memory device 120, a write end signal WT_DONE may be received from the memory device 120. The command counting unit 220 may decrease the count when the write end signal WT_DONE is received. The command counting unit 220 may increase the count when the internal write signal iWT is inputted. However, according to the embodiment of the present invention, the command counting unit 220 may increase and decrease the count in response to the write end signal WT_DONE and the internal write signal iWT, respectively, but the concept and spirit of the present invention are not limited thereto. The command counting unit 220 may generate a counted data DATA_C, which corresponds to the count obtained according to the counting operation, and may transmit the counted data DATA_C to the second ECC encoding unit 240.

Meanwhile, the memory controller 110 may read a data from the memory device 120 using the internal read signal iRD. The internal read signal iRD may be inputted to the memory device 120. In response to the internal read signal iRD, the data DATA_R may be read from the memory device 120. The first ECC encoding unit 230 may perform a first ECC encoding onto the data DATA_R read from the memory device 120 to generate the first ECC encoded data DATA_E1. The first ECC encoding unit 230 may perform the first ECC encoding based on a first frequency FQ1.

In response to the internal send signal iSD, the second ECC encoding unit 240 may detect the counted data DATA_C and may perform a second ECC encoding onto the counted data DATA_C to generate the second ECC encoded data DATA_E2. The second ECC encoding unit 240 may perform the second ECC encoding based on a second frequency FQ2 that is higher than the first frequency FQ1.

The data output unit 250 may combine the first ECC encoded data DATA_E1 and the second ECC encoded data DATA_E2 to output a read data DATA. The data output unit 250 may include a latch 252 for storing the first ECC encoded data DATA_E1. When the first ECC encoded data DATA_E1 is stored in the latch 252, the data output unit 250 may generate the valid signal VALID.

According to the embodiment of the present invention, after the read command RD is entered from the host 130, the corresponding send command SD may be inputted based on the valid signal VALID. Also, the write command word WT may be inputted based on the second ECC encoded data DATA_E2 of the read data DATA.

Figure 3:
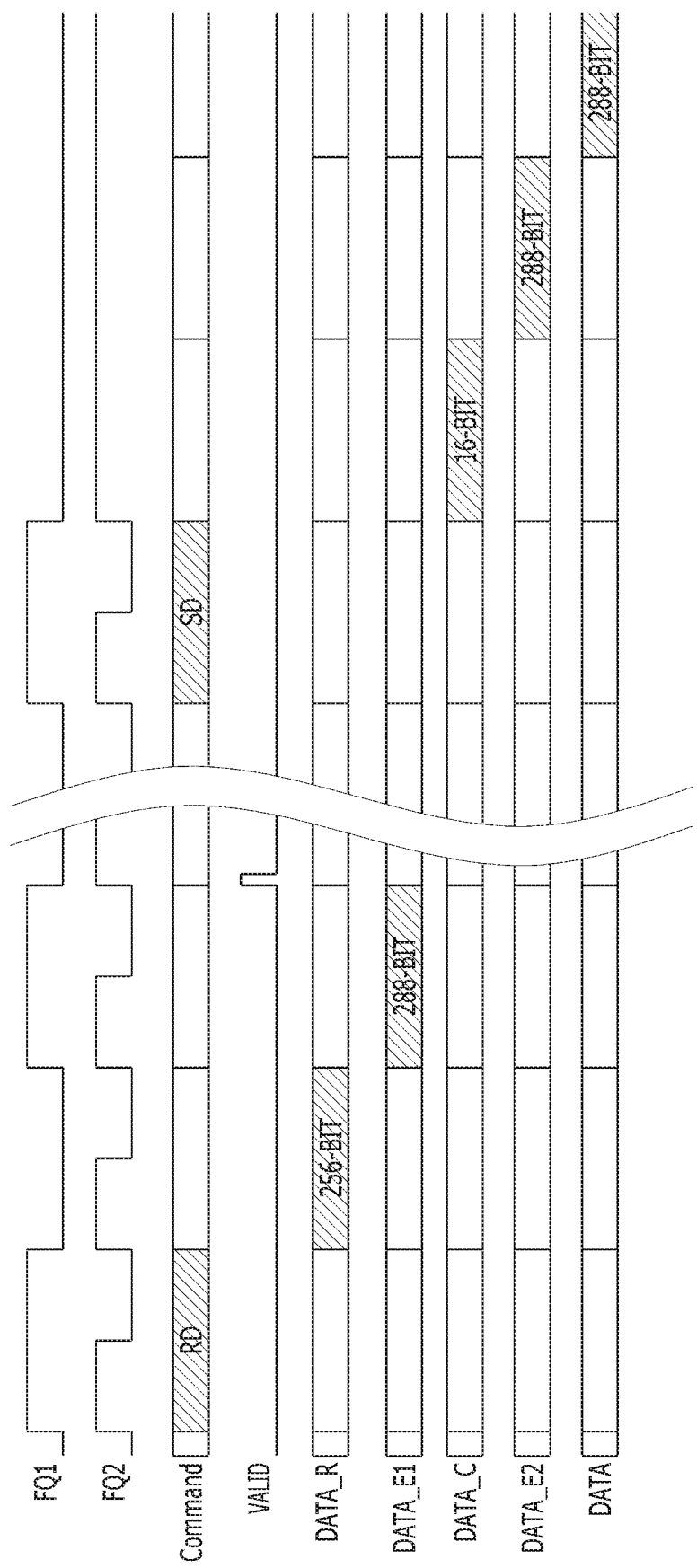
FIG. 3 is a waveform diagram illustrating a signal waveform of the memory controller shown in FIG. 2.

FIG. 3 is a waveform diagram illustrating a signal waveform of the memory controller 110 shown in FIG. 2, according to an embodiment of the present invention. Referring to FIGS. 2 and 3, a specific operation of the memory controller 110 is described below.

First, the write operations of the memory controller 110 may be counted by the command counting unit 220, and the counted data DATA_C may be continuously updated. The counted data DATA_C may include a plurality of bits. The bit number of the counted data may vary according to how the circuit is designed. FIG. 3 exemplarily shows an example in which the counted data DATA_C includes 16 bits.

When the read command RD is inputted from the host 130, the memory controller 110 may read a data from the memory device 120. A plurality of bits of data may be read from the memory device 120 through a single read operation. For example, the memory controller 110 may generally control 256 bits of the read data DATA_R.

The data DATA_R that is read may include the counted data DATA_C to notify the write credit information. Particularly, the counted data DATA_C counted at a moment when the read data DATA_R is outputted may be detected and included so that the write credit information is updated in real time.

Also, an ECC operation may be performed onto the read data DATA_R and the counted data DATA_C to support a channel ECC between the hosts of the memory system 100. However, to prevent the read latency from being increased, the first ECC encoding unit 230 may perform the first ECC encoding onto the read data DATA_R to generate the first ECC encoded data DATA_E1. Herein, the first ECC encoding unit 230 may set the value, corresponding to the counted data DATA_C to be included in the read data DATA_R, to '0' and perform the first ECC encoding.

Referring to the following equation, the ECC operation may be encoded through a matrix operation (G-Matrix) based on various kinds of codes, e.g., a Reed Solomon code and value. Therefore, instead of performing an ECC encoding onto the read data DATA_R and the counted data DATA_C, a first ECC encoding may be performed onto the read data DATA_R by setting a value corresponding to the counted data DATA_C to '0', and a second ECC encoding may be performed onto the counted data DATA_C by setting a value corresponding to the read data DATA_R to '0.' Then the results of the first and second ECC encodings may be combined with each other. The first ECC encoding unit 230 may generate a 288-bit code word, i.e., the first ECC encoded data DATA_E1, corresponding to the read data DATA_R of 256 bits, as well as a 16-bit data which is set to '0'.

By the way of example but not limitation, a mathematical model for the ECC operation, achieved through the first and second ECC encodings, may be described as the following equation.

$$(G-\text{Matrix}) * \begin{pmatrix} \text{DATA\_R} \\ 0 \end{pmatrix} + (G-\text{Matrix}) * \begin{pmatrix} 0 \\ \text{DATA\_C} \end{pmatrix} = $$
$$(G-\text{Matrix}) * \begin{pmatrix} \text{DATA\_R} \\ \text{DATA\_C} \end{pmatrix}$$
[Equation]

The first ECC encoded data DATA_E1 may be stored in the latch 252. Accordingly, the data output unit 250 may generate a valid signal VALID. When the memory controller 110 outputs the generated valid signal VALID to the outside, the host 130 may detect that the read data is prepared based on the valid signal VALID and generate the send command SD.

When the send command SD is inputted to the memory controller 110, the second ECC encoding unit 240 may detect the counted data DATA_C and perform the second ECC encoding. As described above, the second ECC encoding unit 240 may set the value corresponding to the read data DATA_R to '0.' The second ECC encoding unit 240 may perform the second ECC encoding onto the set data and the counted data DATA_C. Accordingly, the second ECC encoding unit 240 may also generate the 288-bit code word, i.e., the second ECC encoded data DATA_E2, corresponding to the data of 256 bits set to '0,' and the 16-bit counted data DATA_C.

The data output unit 250 may output the read data DATA by combining the first ECC encoded data DATA_E1 with the second ECC encoded data DATA_E2. That is, the data output unit 250 may generate the 288-bit read data RATA by adding the 288-bit first ECC encoded data DATA_E1 to the 288-bit second ECC encoded data DATA_E2.

The encoding operation of the relatively large-sized read data DATA_R may be complicated, as compared with the encoding operation of the relatively small-sized counted data DATA_C. According to the embodiment of the present invention, the first ECC encoding may be performed onto the read data DATA_R based on a relatively low first frequency, but the second ECC encoding may be performed onto the counted data DATA_C based on a relatively high second frequency. Increasing the processing speed of the counted data DATA_C and ensuring the stability of the read data DATA_R may enhance the reliability of the read operation of the memory system 100.

Figure 4:
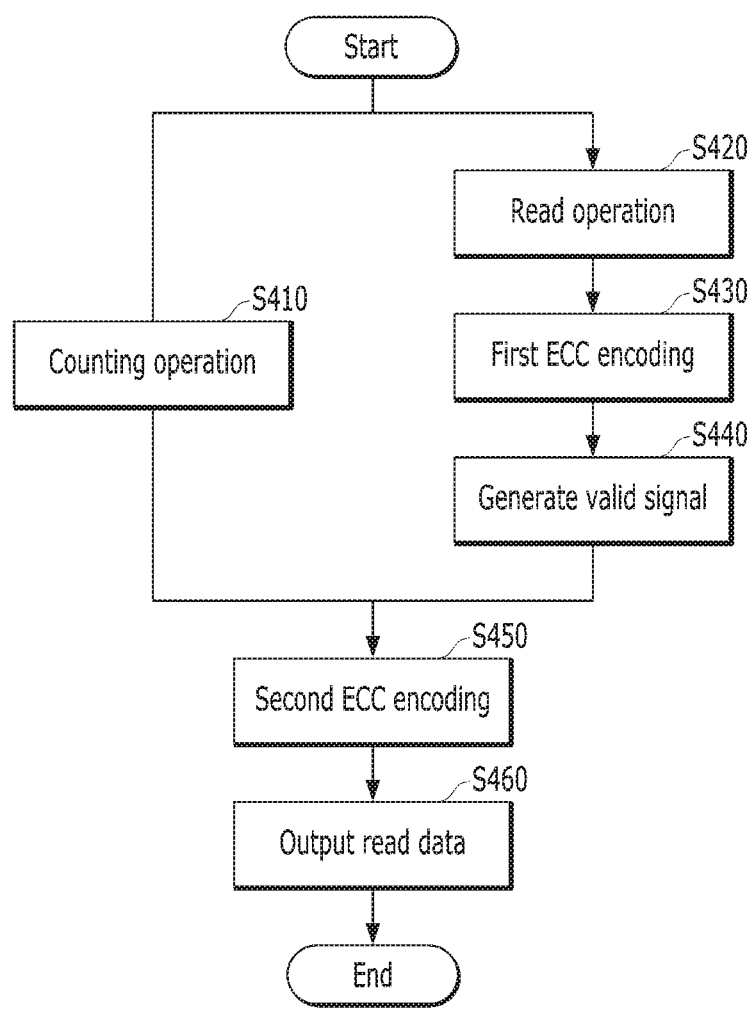
FIG. 4 is a flowchart describing an operation of a memory system in accordance with an embodiment of the present invention.

FIG. 4 is a flowchart describing an operation of the memory system 100 according to an embodiment of the present invention.

1) Count Operation (S410)

When the write command WT is inputted, the command counting unit 220 may perform a counting operation. Herein, the memory controller 110 may write a data into the memory device 120 according to the internal write signal iWT. When the data is written into the memory device 120, a write end signal WT_DONE may be inputted from the memory device 120. The command counting unit 220 may decrease the count when the write end signal WT_DONE is inputted. The command counting unit 220 may increase the count when the internal write signal iWT is inputted. The command counting unit 220 may generate the counted data DATA_C according to the counting operation, 2) Read Operation (S420)

When the read command RD is entered from the host 130, the command input unit 210 may decode the read command 210 to generate an internal read signal iRD. Memory controller 110 may read a data from the memory device 120 according to an internal read signal iRD.

3) First ECC Encoding (S430)

The first ECC encoding unit 230 may perform the first ECC encoding onto the data DATA_R read from the memory device 120. The first ECC encoding unit 230 may perform the first ECC encoding based on the first frequency FQ1 to generate the first ECC encoded data DATA_E1.

4) Generation of Valid Signal (S440)

When the first ECC encoded data DATA_E1 generated in the first

ECC encoding unit 230 is inputted, the data output unit 252 may generate the valid signal VALID. The data output unit 252 may store the first ECC encoded data DATA_E1 in the latch 252. The data output unit 252 may generate the valid signal VALID and output the generated the valid signal VALID to the outside of the memory system 100. The send command SD corresponding to the read command RD may be inputted to the memory system 100 based on the valid signal VALID outputted externally.

5) Second ECC Encoding (S450)

When the send command SD is inputted, the second ECC encoding unit 240 may detect the counted data DATA_C generated in the command counting unit 220 according to the internal send signal iSD. The second ECC encoding unit 240 may perform the second ECC encoding onto the counted data DATA_C to generate the second ECC encoded data DATA_E2. The second ECC encoding unit 240 may perform the second ECC encoding based on the second frequency FQ2 that is higher than the first frequency FQ1 used in the first ECC encoding unit 230.

6) Read Data Outputted (S460)

The data output unit 250 may combine the first ECC encoded data DATA_E1 and the second ECC encoded data DATA_E2, which are stored in the latch 252, to output the read data DATA. Herein, the write command WT of the memory system 100 may be inputted based on the second ECC encoded data DATA_E2 of the read data DATA.

According to the embodiments of the present invention, an ECC operation may be begun in advance onto data that are read from the memory device and prepared in response to a read command. The data in response to the read command is buffered before a send command is entered. Then, another ECC operation may be additionally performed when write credit information is detected at a moment of sending a read data in response to the send command. A latency for ECC operation may be reduced or avoided in a read operation. Therefore, it is possible to provide the write credit information in real time through the read data of the memory device, prevent an increase in a read latency, and support an ECC operation of a channel. Also, it is possible to increase the operation efficiency of the memory system including the memory device when multi-step ECC operations may be performed based on different frequencies according to the sizes of the read data and the write credit information.

While the present invention has been described with respect to the specific embodiments, it will be apparent to those skilled in the art that various changes and modifications may be made without departing from the spirit and scope of the invention as defined in the following claims.

What is claimed is:

1. A memory controller, comprising:
a command input unit suitable for receiving a write command, a read command, and a send command;
a command counting unit suitable for performing a counting operation in response to the write command to produce a counted data;
a first Error Correction Code (ECC) encoding unit suitable for performing a first ECC encoding onto a data that is read from a memory device in response to the read command to produce a first ECC encoded data;
a second ECC encoding unit suitable for performing a second ECC encoding onto the counted data in response to the send command to produce a second ECC encoded data; and
a data output unit suitable for combining the first ECC encoded data with the second ECC encoded data to output a read data.

2. The memory controller of claim 1, wherein the first ECC encoding unit performs the first ECC encoding based on a first frequency, and the second ECC encoding unit performs the second ECC encoding based on a second frequency which is higher than the first frequency.

3. The memory controller of claim 1, wherein the command counting unit generates the counted data by increasing a count when the write command is inputted, and decreasing the count when a data is written in the memory device in response to the write command.

4. The memory controller of claim 1, wherein the write command is inputted based on the second ECC encoded data of the read data.

5. The memory controller of claim 1, wherein the data output unit includes a latch suitable for storing the first ECC encoded data.

6. The memory controller of claim 5, wherein the memory controller generates and outputs a valid signal, when the first ECC encoded data is stored in the latch.

7. The memory controller of claim 6, wherein the send command is inputted based on the valid signal after the read command is inputted.

8. A memory system, comprising:
a memory device that includes a plurality of memory cells; and
a memory controller suitable for reading a data stored in the memory device in response to a read command and performing a first Error Correction Code (ECC) encoding onto the read data to produce a first ECC encoded data,
wherein the memory controller counts a write command to produce a counted data, performs a second ECC encoding onto the counted data in response to a send command to produce a second ECC encoded data, and outputs the first ECC encoded data and the second ECC encoded data as a read data.

9. The memory system of claim 8, wherein the memory controller includes:
a first ECC encoding unit suitable for performing the first ECC encoding based on a first frequency; and
a second ECC encoding unit suitable for performing the second ECC encoding based on a second frequency which is higher than the first frequency.

10. The memory system of claim 9, wherein the memory controller further includes:

a command counting unit suitable for generating the counted data by increasing a count when the write command is inputted as well as decreasing the count when a data is written in the memory device in response to the write command.

11. The memory system of claim 9, wherein the memory controller further includes:
a latch suitable for storing the first ECC encoded data, and the memory controller generates and outputs a valid signal when the first ECC encoded data is stored in the latch.

12. The memory system of claim 11, wherein the send command is inputted based on the valid signal after the read command is inputted.

13. The memory system of claim 8, wherein the write command is inputted based on the second ECC encoded data of the read data.

14. A method for operating a memory system including a memory device and a memory controller, comprising:
performing, by the memory controller, a counting operation in response to a write command to produce a counted data;
reading, by the memory controller, a data from the memory device in response to a read command;
performing, by the memory controller, a first Error Correction Code (ECC) encoding onto the read data to produce a first ECC encoded data;
performing, by the memory controller, a second ECC encoding onto the counted data in response to a send command to produce a second ECC encoded data; and
combining, by the memory controller, the first ECC encoded data with the second ECC encoded data to output a read data.

15. The method of claim 14, wherein the first ECC encoding is performed based on a first frequency, and the second ECC encoding is performed based on a second frequency which is higher than the first frequency.

16. The method of claim 14, wherein the performing of the counting operation includes:
increasing a count when the write command is inputted; and
decreasing the count when a data is written in the memory device in response to the write command.

17. The method of claim 14, further comprising:
inputting the write command based on the second ECC encoded data of the read data.

18. The method of claim 14, further comprising, after the performing of the first ECC encoding onto the read data:
storing the first ECC encoded data; and
generating and outputting a valid signal.

19. The method of claim 18, further comprising:
inputting the send command based on the valid signal.

20. A memory system, comprising:
a memory device for storing data; and
a memory controller suitable for:
performing a first ECC encoding on a data transferred from the memory device, in response to a read command;
performing a second ECC encoding on a counted data regarding a write command, in response to a send command; and
combining results of the separately performed first and second ECC encodings to generate a read data.

* * * * *